United States Patent
Tamura et al.

(10) Patent No.: US 9,219,141 B2
(45) Date of Patent: Dec. 22, 2015

(54) SUPER JUNCTION MOSFET, METHOD OF MANUFACTURING THE SAME, AND COMPLEX SEMICONDUCTOR DEVICE

(71) Applicant: FUJI ELECTRIC CO., LTD., Kawasaki (JP)

(72) Inventors: Takahiro Tamura, Nagano (JP); Yasuhiko Onishi, Nagano (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/326,005

(22) Filed: Jul. 8, 2014

(65) Prior Publication Data
US 2015/0014764 A1 Jan. 15, 2015

(30) Foreign Application Priority Data

Jul. 10, 2013 (JP) ................. 2013-144654

(51) Int. Cl.
| | |
|---|---|
| H01L 29/78 | (2006.01) |
| H01L 29/06 | (2006.01) |
| H01L 29/10 | (2006.01) |
| H01L 29/66 | (2006.01) |
| H01L 21/26 | (2006.01) |

(52) U.S. Cl.
CPC ............ *H01L 29/7804* (2013.01); *H01L 21/26* (2013.01); *H01L 29/0634* (2013.01); *H01L 29/1095* (2013.01); *H01L 29/66712* (2013.01); *H01L 29/7806* (2013.01)

(58) Field of Classification Search
CPC ............ H01L 29/7804; H01L 29/0634; H01L 29/1095; H01L 29/66712; H01L 29/7806; H01L 21/26
See application file for complete search history.

(56) References Cited

U.S. PATENT DOCUMENTS

| | | |
|---|---|---|
| 6,967,374 B1 | 11/2005 | Saito et al. |
| 2002/0185705 A1 | 12/2002 | Saitoh et al. |
| 2007/0048982 A1 | 3/2007 | Nemoto et al. |
| 2007/0108512 A1* | 5/2007 | Sedlmaier et al. .. H01L 29/0634 257/328 |
| 2008/0246096 A1 | 10/2008 | Sakakibara et al. |
| 2011/0147829 A1 | 6/2011 | Nakajima |

FOREIGN PATENT DOCUMENTS

| | | |
|---|---|---|
| JP | H07-226405 A | 8/1995 |
| JP | 2001-102577 A | 4/2001 |
| JP | 2003-101022 A | 4/2003 |
| JP | 2006-024690 A | 1/2006 |
| JP | 2007-059801 A | 3/2007 |
| JP | 2008-258313 A | 10/2008 |
| WO | WO-2010/24433 A1 | 3/2010 |

* cited by examiner

*Primary Examiner* — Tucker J Wright
(74) *Attorney, Agent, or Firm* — Rabin & Berdo, P.C.

(57) ABSTRACT

A super junction MOSFET is disclosed. The super junction MOSFET includes a plurality of mutually parallel pn junctions extending in a vertical direction on a first principal surface of an n-type semiconductor substrate; a parallel pn layer in which n-type drift regions and p-type partition regions, each sandwiched between the adjacent pn junctions, are disposed alternately in contact with each other; and an MOS gate structure on the first principal surface side of the parallel pn layer, wherein an n-type first buffer layer and second buffer layer are in contact in that order on the opposite principal surface side, and the impurity concentration of the first buffer layer is a concentration that is equal to or less than the same level as that of the impurity concentration of the n-type drift region.

7 Claims, 10 Drawing Sheets

SUPER JUNCTION MOSFET, METHOD OF MANUFACTURING THE SAME, AND COMPLEX SEMICONDUCTOR DEVICE

CROSS REFERENCE TO RELATED APPLICATION

The entire disclosure of the inventor's corresponding Japanese patent application, Serial No. JP PA 2013-144654, filed Jul. 10, 2013, is hereby incorporated by reference.

BACKGROUND OF THE INVENTION

1. Field of the Invention

The present invention relates to a vertical MOSFET (insulated gate field effect transistor), a method of manufacturing the vertical MOSFET, and a complex semiconductor device.

2. Description of the Background Art

Figure 6:
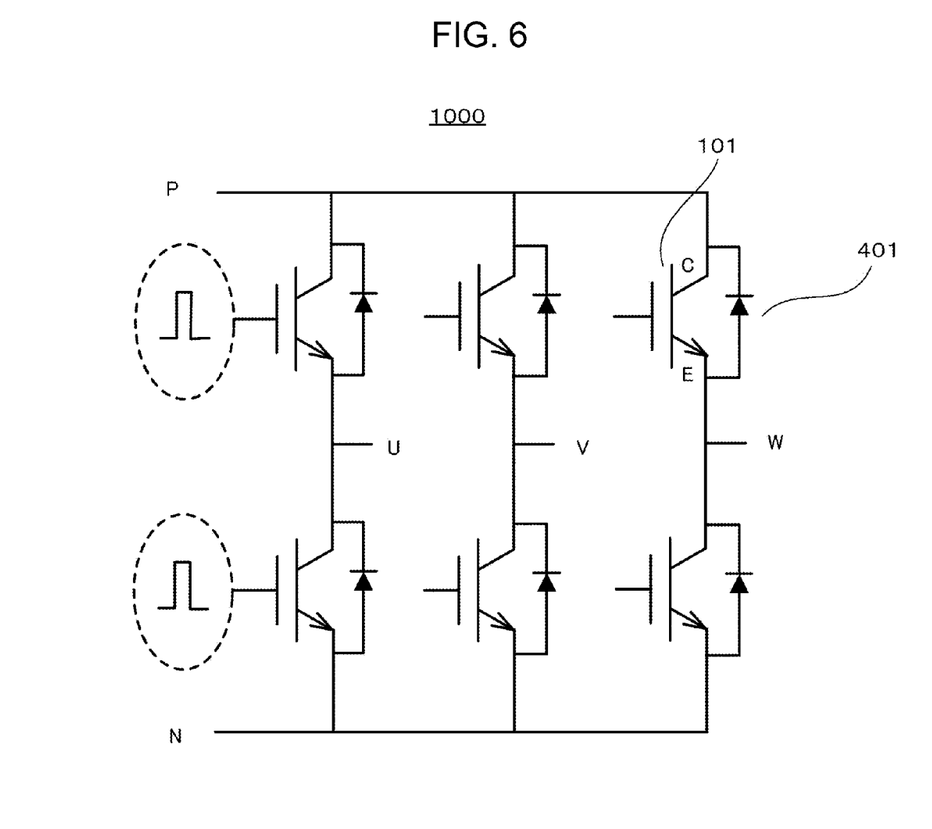
FIG. 6 is an inverter circuit diagram.

As a high breakdown voltage switching element used for an inverter circuit 1000 shown in FIG. 6, an IGBT 101 is widely used. The IGBT 101, having features of a bipolar transistor, such as a high breakdown voltage and a low on voltage, and the superior feature of being able to operate at high speed although being lower in speed than an MOSFET, is an important semiconductor element which underpins the present power electronics.

Figure 7A:
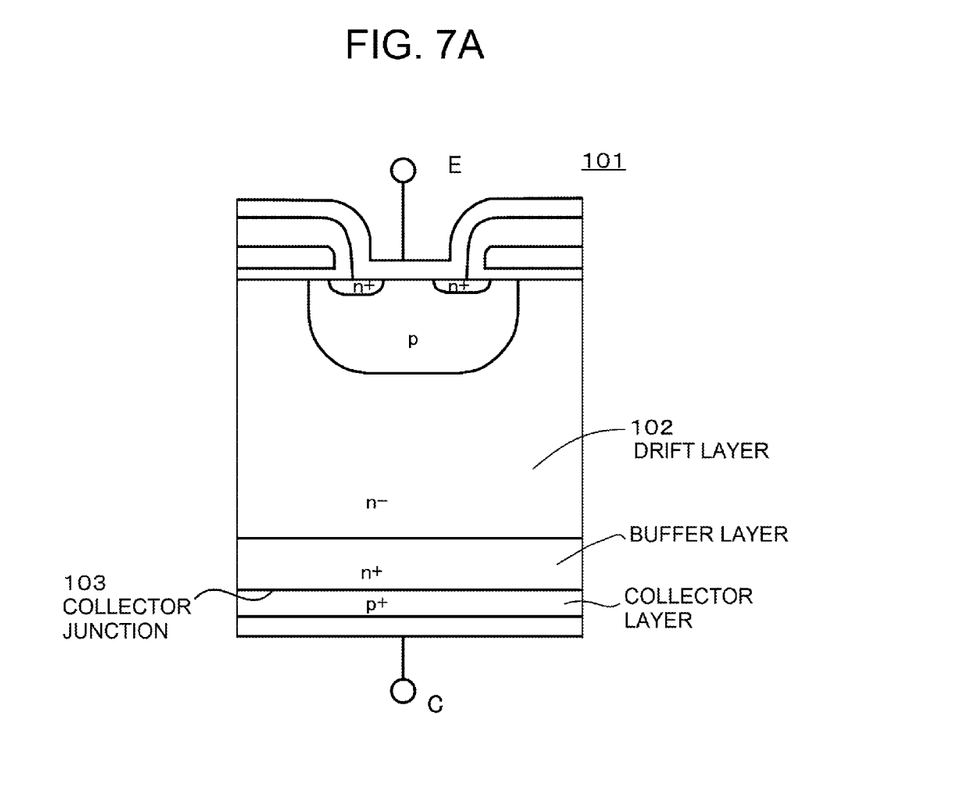
FIGS. 7A and 7B are main portion sectional views of the substrates of a standard IGBT and MOSFET respectively.
Figure 7B:
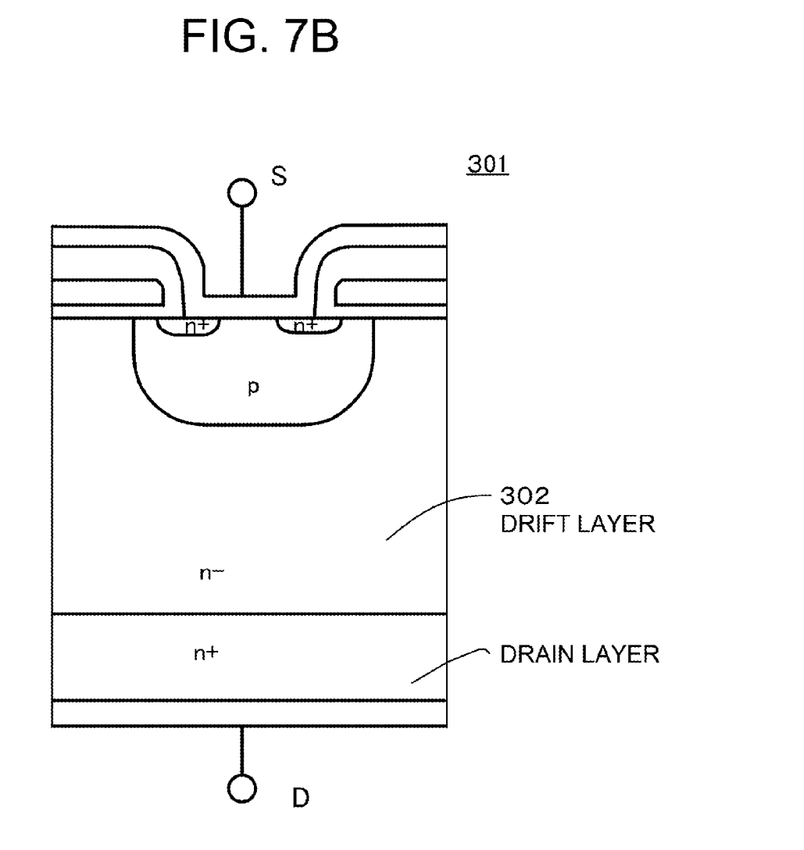

However, the IGBT 101 shown in a main portion sectional view of FIG. 7A, as it has a reverse breakdown voltage junction (a collector junction 103), unlike an MOSFET 301 shown in FIG. 7B, usually cannot cause current to flow in a reverse direction (a bias direction in which an emitter E is positive and a collector C is negative). When the IGBT 101 changes from a conduction state to a forward blocking state, it may happen that a high surge voltage is generated in the reverse direction due to an inductance component in the circuit. There is fear that the IGBT 101 which is not protected from a reverse breakdown voltage usually breaks down when the surge voltage is applied to the IGBT 101, but when the IGBT 101 is used in the inverter circuit, the IGBT 101 is protected by a diode 401 (FIG. 6) connected in reverse parallel to the IGBT 101 in order to reflux an L load current generated every time the IGBT 101 is turned off.

Figure 5A:
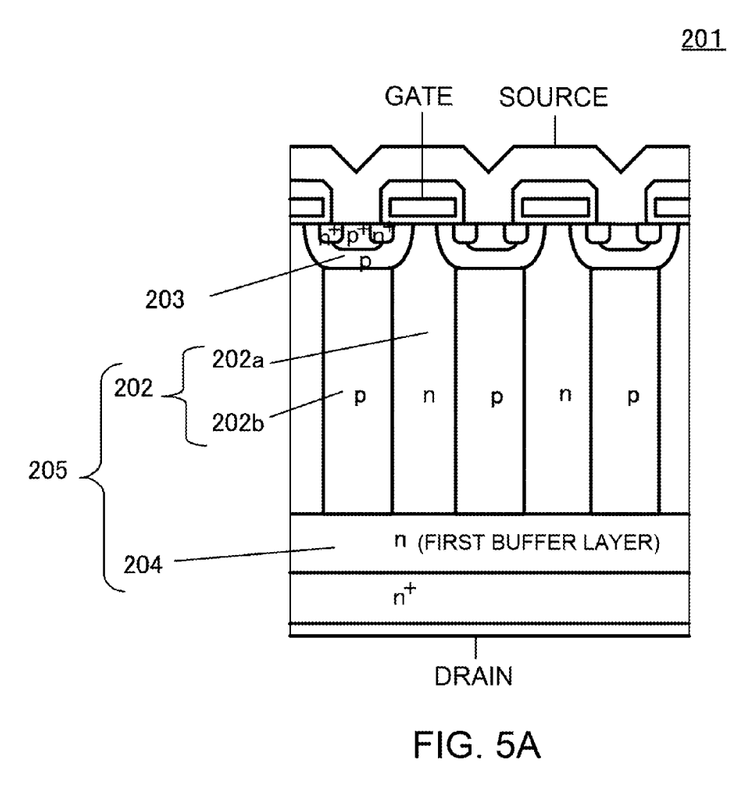
FIG. 5A is a main portion sectional view of the heretofore known super junction MOSFET.

As the parallel connection of the standard flux diode 401 to the previously described kind of IGBT 101 has a limitation in increasing the speed of switching, it has recently been studied, in response to a growing demand for an increase in the frequency of an inverter, to replace the IGBT 101 with a super junction MOSFET 201 shown in FIG. 5A. The super junction MOSFET 201 (FIGS. 5A and 5B), with which it has been studied to replace the IGBT 101, has in a drift layer 205 a parallel pn layer 202 of a super junction structure wherein a plurality of parallel pn junctions are narrowly spaced in a direction perpendicular to the principal surface. The inner region of the parallel pn layer 202 is formed of n-type drift regions 202a and p-type partition regions 202b. As the super junction MOSFET 201 is such that it is possible to deplete all the parallel pn layer 202 at a low voltage by narrowing the pitch width of the parallel pn layer 202 even when the concentration of the n-type drift regions 202a in the parallel pn layer 202 is made higher than a standard impurity concentration compatible with a breakdown voltage, the super junction MOSFET 201, despite being of a unipolar type, has the feature of being and high in breakdown voltage and low in on resistance. Furthermore, the super junction MOSFET 201, as it is capable of high speed switching deriving from a unipolar device, as well as having a built-in reverse diode structure (reference signs 203 and 202a in FIG. 5A), also has the advantage of it being possible to hope for a reduction in the size of the device without a need to newly connect the parallel diode 401 of the inverter circuit of FIG. 6.

Figure 5B:
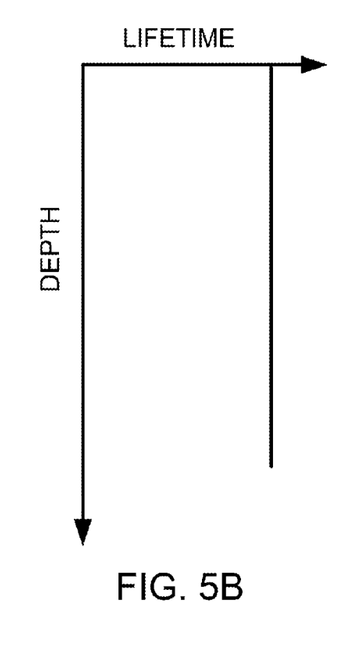
FIG. 5B is a carrier lifetime distribution chart in the substrate thereof.

In the super junction MOSFET 201, the carrier lifetime during the reverse recovery of the built-in diode, when not being controlled, is constant in a depth direction from the front surface of a substrate, as shown in FIG. 5B.

A document relating to this kind of super junction MOSFET is disclosed in which it is described that a super junction (hereafter SJ) structure formed of a parallel pn layer, and an n-type buffer layer below the SJ structure, the impurity concentration of which is changed in two stages, are provided in the drift layer 205, thereby reducing on resistance and forming the reverse recovery characteristics of a built-in diode into a soft recovery waveform (JP-A-2003-101022 (FIG. 11 and Paragraphs 0077 to 0079)). A semiconductor device including a super junction MOS structure wherein a reverse recovery time is shortened without increasing a drain-source leak current is already known (Domestic Re-publication of PCT Application 2010-24433 (Abstract)). Also, it is described that an SJ-MOSFET is connected to a schottky barrier diode including the SJ structure, thereby enabling a semiconductor device suitable for a soft switching system (JP-A-2006-24690 (Problem and Solution in Abstract)). It is shown that a lifetime control region is provided in the whole of the schottky barrier diode including the SJ structure, thus reducing a reverse current and improving reverse recovery characteristics (JP-A-2008-258313 (Abstract)). A description is given of a lifetime control method for forming reverse recovery characteristics into a soft recovery waveform (JP-A-2007-59801 (Abstract)). Various descriptions are given of an excess minority carrier lifetime control method (JP-A-7-226405 (Problem)). Furthermore, a description relating to a semiconductor device wherein it is possible to improve breakdown voltage and turn-off characteristics compared with a heretofore known element is disclosed (JP-A-2001-102577 (Problem)).

Figure 4:
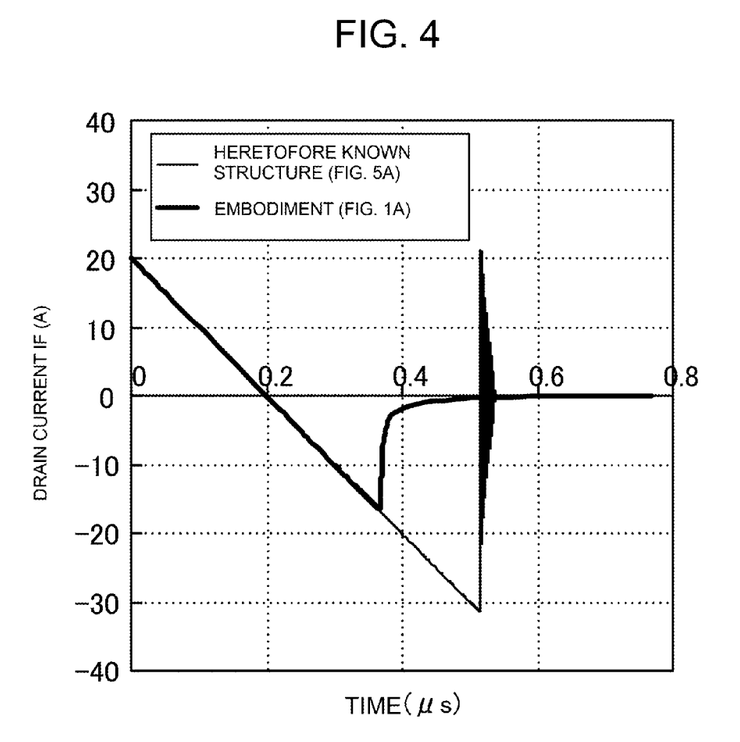
FIG. 4 is a diagram showing reverse recovery waveforms of the heretofore known super junction MOSFET and the super junction MOSFET according to the embodiment of the invention.

In the super junction MOSFET 201 shown in FIG. 5, when in a forward blocking state, a depletion layer expands all the way out in each column in the parallel pn layer at a low breakdown voltage and is completely depleted. At this time, the built-in diodes 203 and 202a transit from a state, in which a forward current (a reflux current) is flowing, to a reverse bias blocking state (that is, a reverse recovery state) of the pn junctions of the built-in diodes. However, the built-in diodes are such that, because of a unipolar structure, there are very few minority carriers, and a reverse recovery current Irp is small, and in addition, that it is easy to form a so-called hard recovery waveform wherein a current waveform and voltage waveform rise steeply. When a reverse recovery operation forms a hard recovery waveform, the problem is that ringing occurs (an oscillatory waveform is formed), thus causing noise generation, as shown in a reverse recovery waveform diagram of the heretofore known super junction MOSFET of FIG. 4 (in FIG. 4, the oscillatory waveform portions are overlapped in a blacked out condition and difficult to see). The waveform of the heretofore known structure of FIG. 4 is a result from simulating a reverse recovery operation current waveform with a supply voltage set to be 400V, a forward current set to be 20 A, and a temporal change in reverse current set to be 100 A/μs, for the vertical super junction MOSFET of the heretofore known structure shown in FIG. 5A.

SUMMARY OF THE INVENTION

The invention, having been contrived bearing in mind the heretofore described points, has an object of providing a super junction MOSFET, a method of manufacturing the super junction MOSFET, and a complex semiconductor device, wherein it is possible to obtain high speed switching and low reverse recovery loss by relaxing a hard recovery waveform when in reverse recovery operation and thus reducing a reverse recovery current Irp and reverse recovery time trr.

In order to achieve the object, a super junction MOSFET includes a plurality of mutually parallel pn junctions extending in a vertical direction on the first principal surface of a first conductivity type drain layer; a parallel pn layer in which first conductivity type drift regions and second conductivity type partition regions, each sandwiched between the adjacent pn junctions, are disposed in alternate contact with each other; and an MOS gate structure on the first principal surface side of the parallel pn layer, wherein a first conductivity type first buffer layer and second buffer layer are provided, in this order from the second principal surface side of the parallel pn layer, between the second principal surface of the parallel pn layer and the first principal surface of the drain layer, the impurity concentration of the first buffer layer is a low concentration which is equal to or less than the same level as that of the impurity concentration of the drift region, the impurity concentration of the second buffer layer is higher than that of the drift region, and the parallel pn layer is shorter in carrier lifetime than the second buffer layer. It is preferable that a method of manufacturing the super junction MOSFET includes making the carrier lifetimes of the parallel pn layer and first buffer layer shorter than that of the second buffer layer by adding a heavy metal or irradiating charged particles. It is preferable that a pin diode higher in speed and smaller in on resistance than a pn diode built into the super junction MOSFET is connected in reverse parallel to the super junction MOSFET. It is preferable that a schottky barrier diode higher in speed and smaller in on resistance than a pn diode built into the super junction MOSFET is connected in reverse parallel to the super junction MOSFET.

According to the invention, it is possible to provide a super junction MOSFET, a method of manufacturing the super junction MOSFET, and a complex semiconductor device, wherein it is possible to obtain high speed switching and low reverse recovery loss by relaxing a hard recovery waveform during a reverse recovery operation and thus reducing a reverse recovery current Irp and reverse recovery time trr.

DETAILED DESCRIPTION OF THE INVENTION

Hereafter, a detailed description will be given, referring to the drawings, of an embodiment relating to a super junction MOSFET, a method of manufacturing the super junction MOSFET, and a complex semiconductor device, of the invention. In the present specification and the accompanying drawings, n and p mean that electrons or holes are majority carriers in layers and regions prefixed with n or p. Also, + or − superscribed after n and p respectively means relatively high or low in impurity concentration. In the following description of the embodiment and the accompanying drawings, the same reference signs will be given to the same components, and a redundant description will be omitted. Also, the accompanying drawings described in the embodiment are not depicted on an exact scale or at an exact dimensional ratio for ease of visualization and comprehension. The invention is not limited to the description of the embodiment, to be described hereafter, without departing from the scope of the invention.

First Embodiment

Figures 1A, 1B:
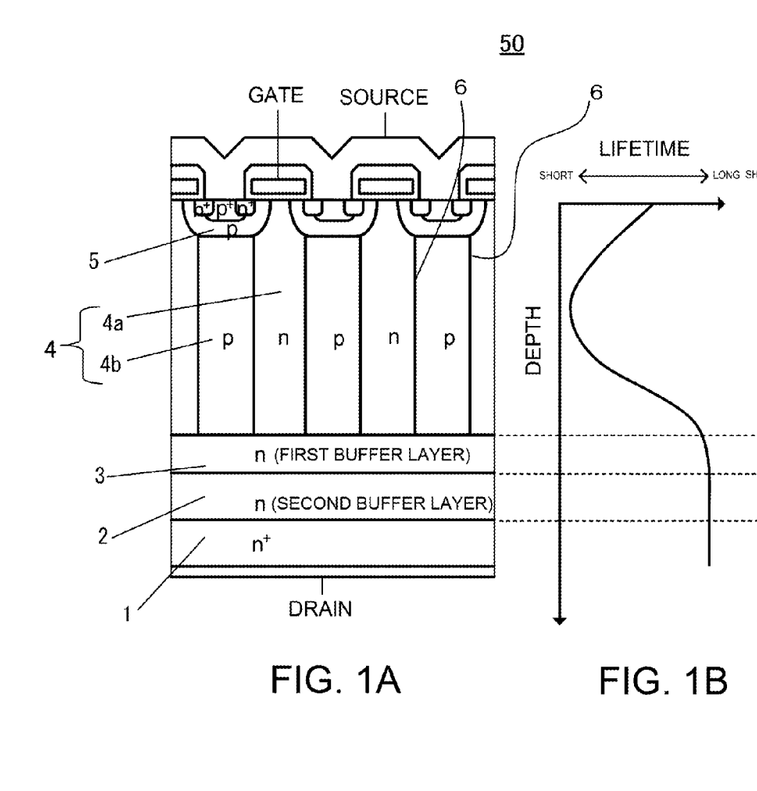
FIG. 1A is a main portion sectional view of a super junction MOSFET according to a first embodiment of the invention.
FIGS. 1B, 1C, and 1D are carrier lifetime distribution charts in a substrate which correspond to FIG. 1A.
Figure 1C:
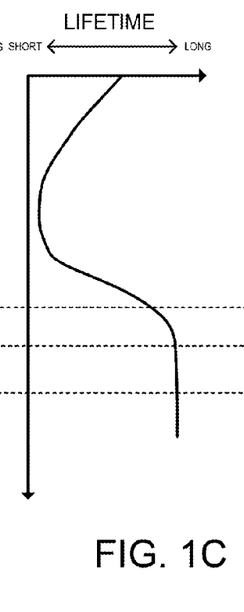
Figure 1D:
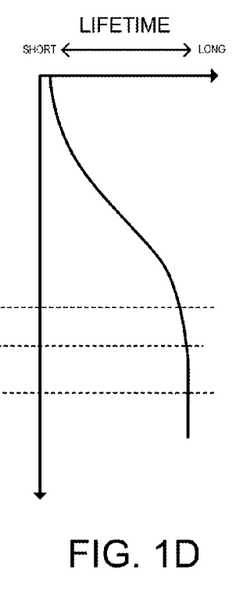

FIG. 1A shows a main portion sectional view of an element active portion of a vertical super junction MOSFET according to the invention. FIGS. 1B, 1C, and 1D are carrier lifetime distribution charts with the depth of the super junction MOSFET shown in FIG. 1A related to the vertical axis and the lifetime thereof on the horizontal axis, and although the depth ranges of the respective lifetime-controlled regions are different from each other, are all of the preferred super junction MOSFET according to the invention.

The super junction MOSFET includes an n-type second buffer layer 2 of a higher concentration than an n-type drift region 4a, and an n-type first buffer layer 3 of a concentration equal to or lower than the drift region 4a, on an $n^+$-type semiconductor substrate ($n^+$drain layer 1) of a high concentration, and includes a parallel pn layer 4 on the n-type first buffer layer 3. The pattern of a cross section of the parallel pn layer 4 taken along a plane parallel to the front surface of a substrate is stripe-lie. The pattern, not being limiting to this, may be grid-like. The n-type second buffer layer 2 has a function acting as a carrier reservoir when the super junction MOSFET is in reverse recovery operation, and has the advantageous effect of lengthening a reverse recovery time by lengthening a carrier discharge time, and thus forming a soft recovery waveform.

In a first embodiment, hereafter, a detailed description will be given of a vertical super junction MOSFET classified with a breakdown voltage of 600V. The outline of the dimension, impurity concentration, and the like, of each layer and region will be shown in the following. A thickness of the parallel pn layer 4 in a depth direction (hereafter, the thickness is taken to be a distance in the thickness direction of the substrate) is set to be 36.0 μm, the pitch width of the parallel pn layer 4 is set to be 12.0 μm, the respective widths of an n-type drift region and p-type partition region are 6.0 μm, and the impurity concentration of each of the regions is set to be $3.0\times10^{15}$ $cm^{-3}$. The thickness of the n-type first buffer layer 3 immediately below the parallel pn layer 4 is set to be 9 μm, and the impurity concentration thereof is set to be $1.0\times10^{15}$ $cm^{-3}$ which is lower than that of the n-type drift region. The n-type second buffer layer 2 is further provided below the n-type first buffer layer 3, and the thickness of the n-type second buffer layer 2 is set to be 15 μm so as to prevent a depletion layer expanding all the way out even when in reverse recovery operation, while the impurity concentration thereof is set to be $1.0\times10^{16}$ $cm^{-3}$ which is higher than that of the n-type drift region. Also, the impurity concentration of the $n^+$drain layer 1 is set to be $2.0\times10^{18}$ $cm^{-3}$.

In the outlined carrier lifetime distribution charts shown in FIGS. 1B to 1D, in any case, the carrier lifetime of the n-type second buffer layer 2 is not controlled, or is prevented from being short compared with those of the parallel pn layer 4 and first buffer layer 3. The carrier lifetimes of one or all of the regions other than the second buffer layer 2 are locally shortened. A basic electron lifetime is set to be $1.0\times10^{-5}$ seconds, while a basic hole lifetime is set to be $3.0\times10^{-6}$ seconds, and when the carrier lifetimes are shortened, the lowest value of the electron carrier lifetime is set to be $1.0\times10^{-7}$ seconds, while the lowest value of the hole carrier lifetime is set to be $3.0\times10^{-8}$ seconds. As it is only necessary that carriers are sufficiently held on the n-type second buffer layer 2 when in reverse recovery operation, it is possible to obtain a soft recovery waveform in any one of the distributions in FIG. 1B long in carrier lifetime to FIG. 1D.

The carrier lifetime distributions in FIGS. 1B and 1C can be created by locally controlling the lifetimes by ion implanting protons, or the like, so that optional depths (for example, the front surface side depth of the parallel pn layer in FIG. 1B and the rear surface side depth of the parallel pn layer in FIG. 1C) reach their respective peaks by irradiating protons or the like from the rear surface of the substrate and heat-treating the substrate. When protons or the like are ion implanted from the drain layer side in this way, a lifetime killer is introduced into the second buffer layer 2 too. However, it is only necessary to prevent a lifetime killer from being introduced into the second buffer layer 2 as much as possible by adopting a formation such that the peak concentration is not positioned in the second buffer layer 2. When platinum is used as a lifetime killer and diffused, it is possible to obtain a distribution wherein the carrier lifetime on the front surface side has a shortest inclination, as shown in FIG. 1D, because it is easy for platinum to segregate to the front surface side of the substrate.

Figures 2A, 2B:
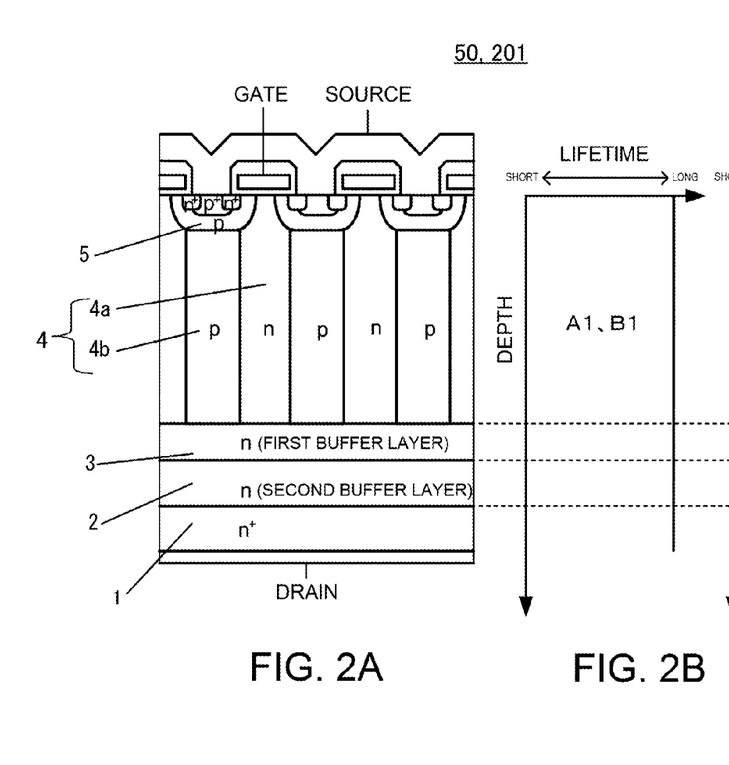
FIG. 2A is a main portion sectional view of a heretofore known super junction MOSFET and the super junction MOSFET according to the invention.
FIGS. 2B to 2E are mutually different carrier lifetime distribution charts in the substrate which correspond to FIG. 2A.
Figure 2C:
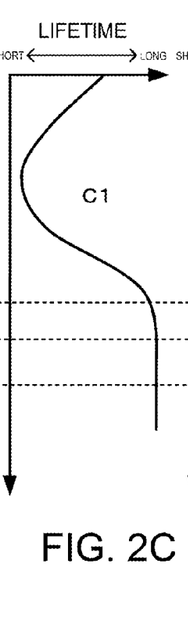
Figure 2D:
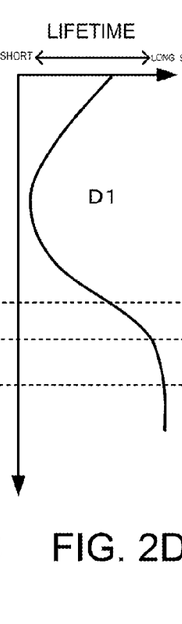
Figure 2E:
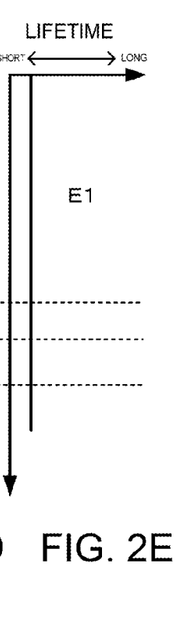
Figure 3:
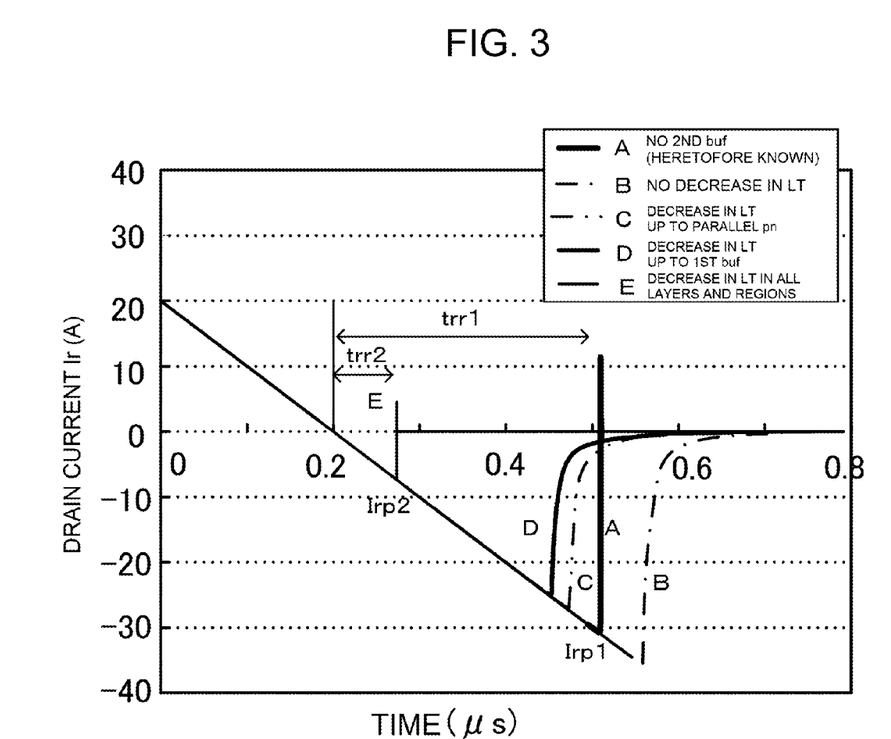
FIG. 3 is a diagram showing respective reverse recovery current waveforms corresponding to the carrier lifetime distribution charts of the super junction MOSFETs of FIGS. 2B to 2E.

Herein, in order to clarify the advantageous effect of the invention, the relationship between conditions A1 to E1 of the kinds of carrier lifetime distributions shown in FIGS. 2B to 2E and recovery waveforms has been examined on the previously described heretofore known super junction MOSFET and the super junction MOSFET of the first embodiment. FIG. 3 shows recovery waveforms A to E obtained as a result of the examination. The carrier lifetime distributions of FIGS. 2B to 2E correspond to those of FIG. 3. FIG. 3 shows results from simulating reverse recovery operation current waveforms with a supply voltage set to be 400V, a forward current set to be 20 A, and a time change in reverse current set to be 100 A/μs, for each of the previously mentioned super junction MOSFETs.

Hereafter, a detailed description will be given of the conditions A1 to E1 of the carrier lifetime distributions. A1, being of the case of the heretofore known super junction MOSFET having only the parallel pn layer and n-type first buffer layer, is a lifetime distribution wherein the lifetime control of FIG. 2B is never carried out. No 2nd buf indicated in FIG. 3 as A corresponding to A1 means that there is no second buffer layer. B1 is of the case of the super junction MOSFET, including the parallel pn layer and n-type first and second buffer layers, which has the lifetime distribution of FIG. 2B wherein there is no lifetime control. No decrease in LT indicated in FIG. 3 as B corresponding to B1 means that there is no lifetime control. C1 is of the case of the super junction MOSFET including the parallel pn layer and n-type first and second buffer layers, wherein the region in FIG. 2C from the front surface of the substrate to the lower end face of the parallel pn layer is locally lifetime-controlled, and C1 corresponds to C in FIG. 3. D1 is of the case of the super junction MOSFET including the parallel pn layer and n-type first and second buffer layers, wherein the region from the front surface of the substrate to the first buffer layer is locally lifetime-controlled, and D1 corresponds to D in FIG. 3. Also, the distributions of C1 and D1 are the same as respective lifetime distributions equivalent to FIGS. 1B and 1C. E1 is of the case of the super junction MOSFET including the parallel pn layer and n-type first and second buffer layers, wherein the whole region of the substrate is lifetime-controlled, and E1 corresponds to E in FIG. 3.

According to FIG. 3, A is such that both a reverse recovery current peak Irp1 and reverse recovery time trr1 are large, and shows a hard recovery waveform which rises steeply, forming a waveform which oscillates greatly. The reason is that, as there is no second buffer layer, carriers are more easily depleted as a depletion layer is expanding during reverse recovery when attaining a forward blocking state.

As B includes the second buffer layer of a higher concentration than the drift region in the parallel pn layer, the second buffer layer functions as a carrier reservoir when in reverse recovery operation. As the total amount of carriers increases in this case, a reverse recovery current Irp increases, and the recovery waveform softens, but as it takes time to discharge the carriers, the reverse recovery time becomes longer, which does not meet high speed switching requirements.

C is preferable because, when the lifetime in the region from the front surface of the substrate to the depth of the lower end of the parallel pn layer is controlled to be shortened, the reverse recovery current Irp becomes less than in B, as well as it being possible to maintain the soft recovery waveform, and the reverse recovery time also becomes shorter.

D is preferable because the lifetime in the region from the front surface to the depth of the lower end of the first buffer layer is controlled to be shortened, the reverse recovery current Irp is more reduced than in C, as well as it being possible to maintain the soft recovery waveform, and the reverse recovery time also becomes much shorter.

E is not preferable because, when the lifetimes in all the layers and regions of the substrate are controlled to be shortened, the carrier reservoir becomes less effective, and both a reverse recovery current Irp2 and reverse recovery time trr2 become too small, thus exhibiting a hard recovery waveform, raising fear that an oscillatory waveform is generated.

Consequently, it can be seen from the carrier lifetime distributions A to E shown in FIG. 3 that the recovery waveform of the super junction MOSFET wherein the lifetime in the region from the front surface of the substrate to the parallel pn layer or to the first buffer layer is controlled, as in C and D, is most preferable, and that it is possible to obtain high speed switching and low reverse recovery loss.

According to the above result, the first embodiment realizes a structure which balances the achievement of an increase in reverse recovery operation speed, and a reduction in loss, of the super junction MOSFET with the formation of a soft recovery waveform.

In the first embodiment, the substrate cross section of the parallel pn layer is patterned into a shape wherein the continuous stripe-like patterns of p and n are in alternate contact with each other, but the parallel pn layer may be formed into a shape wherein p and n layers are disposed in a grid-like non-continuous cross-sectional pattern in a plane of the substrate (in other words, into a shape wherein columnar p and n layers are in alternate contact with each other).

Also, in the first embodiment of the invention, after the n-type second buffer layer 2 and n-type first buffer layer 3 are formed on the n$^+$drain layer 1 of a high concentration, the parallel pn layer 4 is formed by a multistage epitaxial method which repeatedly carries out a multitude of numbers of epitaxial growths and photolithographic techniques and thus stacks parallel pn layers sequentially in the same pattern to a desired thickness. Also, a trench embedding method may be used whereby after the n-type second buffer layer 2, the n-type first buffer layer 3, and a drift layer of a desired thickness are epitaxially grown on the n$^+$drain layer 1 of a high concentration, a vertical trench of a depth equivalent to the thickness of the parallel pn layer is formed by anisotropic etching, and a p-type silicon layer is epitaxially grown in the vertical trench, thus forming the parallel pn layer 4. An MOS gate structure, a source electrode, and a rear surface side drain electrode are formed on the front surface side of the parallel pn layer created by one of the previously described methods, thereby substantially completing the wafer process of the super junction MOSFET of the first embodiment according to the invention. Also, as the methods of manufacturing parallel pn layers and wafers, heretofore known manufacturing methods can also be utilized for each previously described method of forming the parallel pn layer and the subsequent wafer process.

Usually, in a power diode, as a method of shortening the carrier lifetime, a lifetime killer introduction method is commonly used whereby a level is daringly formed in a band gap by adding a heavy metal, such as Au or Pt, or irradiating an electron beam or charged particles such as protons. This is because, by introducing this kind of lifetime killer, it is possible to hasten the extinction of the carriers in the diode when in reverse recovery operation, reduce the peak current Irp and reverse recovery time trr during reverse recovery, and reduce loss during reverse recovery. In the super junction MOSFET too, as a diode is built thereinto, it is effective to introduce a lifetime killer and form the carrier lifetime distributions shown in FIGS. 1B to 1D in order to achieve a high speed operation and a reduction in reverse recovery loss.

However, the super junction MOSFET is such that because of its structure, the drift layer is completely depleted to deplete carriers when in the forward blocking state, meaning that the reverse recovery waveform rises steeply, and it is thus easy to form a hard recovery waveform. According to the heretofore known kind of carrier lifetime control, it is possible to reduce reverse recovery loss, but in this case, as the recovery waveform rises more steeply, the generation of the oscillatory waveform is not eliminated.

Therefore, in the super junction MOSFET of the first embodiment of the invention, the second buffer layer of a higher concentration than the n-type drift region 4a of the parallel pn layer is formed on the lower surface of the first buffer layer. Furthermore, the carrier lifetimes of the first buffer layer and parallel pn layer are adjusted to be shorter than the carrier lifetime of the second buffer layer. The hard recovery waveform is kept rising gently only by adjusting the carrier lifetimes in this way, and it is thus possible to form a soft recovery waveform.

As the method of locally controlling the lifetimes, the control can be carried out by adding a heavy metal, such as gold or platinum, or irradiating charged particles such as protons. A heavy metal can be added up to the first buffer layer by being ion implanted from the source region side surface and heat-treated. Also, after the source electrode is formed, the opposite side of the substrate is cut by grinding, the first buffer layer and second buffer layer are formed, and heavy metal ions or charged particles can be irradiated from the front surface of the second buffer layer. Also, it is also possible to combine the local lifetime control and a control, such as electron beam irradiation, whereby the lifetimes are made uniform.

The impurity concentration and thickness of the second buffer layer are adjusted to form a carrier reservoir such that no depletion layer reaches the n$^+$drain layer 1 even when in the forward blocking state of the super junction MOSFET, thereby enabling the reverse recovery waveform to rise gently without depleting the carriers in the drift layer even when in reverse recovery operation.

Figure 8A:
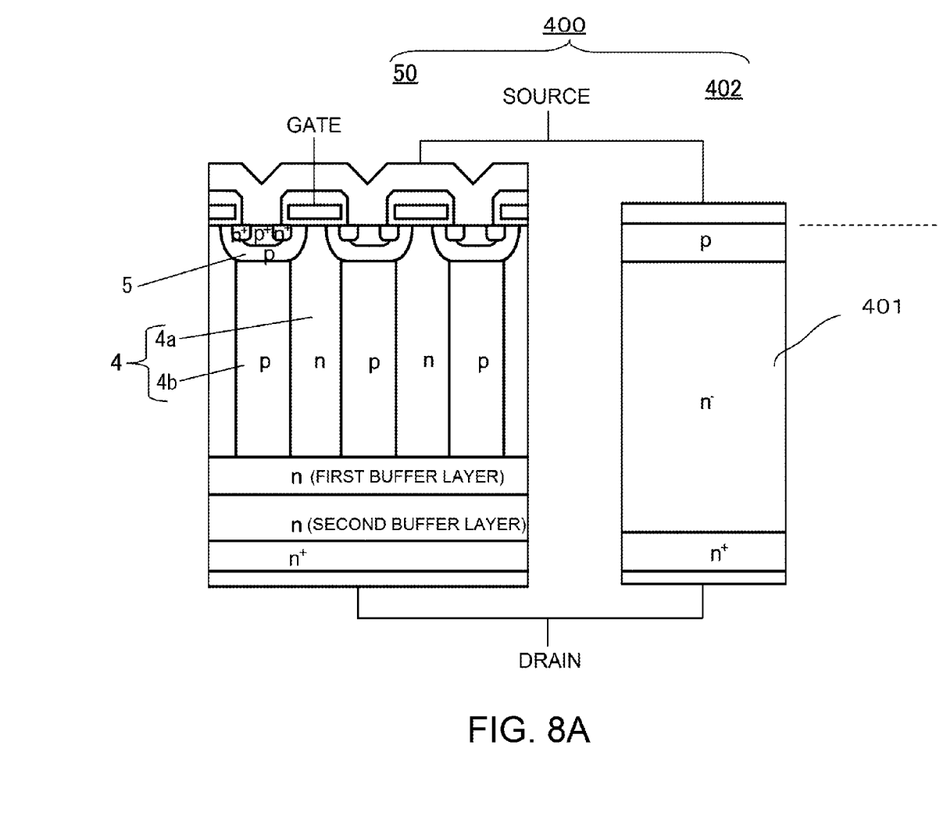
FIG. 8A is a main portion sectional view of the super junction MOSFET according to the invention to which a pin diode is connected in parallel.

Furthermore, FIG. 8A is a main portion sectional view of a complex semiconductor device 400 including a separate pin diode 402 joined in reverse parallel to the super junction MOSFET of FIG. 1A.

Figure 8B:
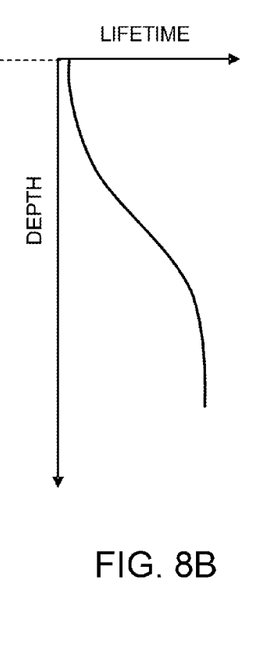
FIG. 8B is a carrier lifetime distribution chart in the substrate of the pin diode.

By adopting this kind of complex semiconductor device, it is also possible to relax the hard recovery waveform when in reverse recovery operation, thus reducing the reverse recovery current Irp and reverse recovery time trr, and thus to obtain high speed switching and low reverse recovery loss. In this case, the pin diode 402 is such that, with the drift layer 401 set to have an impurity concentration of $3.0 \times 10^{14}$ cm$^{-3}$ and a thickness of 60.0 μm, a distribution having a short carrier lifetime on the front surface side is formed by adding a heavy metal such as gold or platinum, as shown in FIG. 8B. It is preferable to use platinum because, as platinum is easily depleted to the front surface side of the substrate, it is possible to obtain a distribution having an inclination such that the front surface side carrier lifetime is shortest, as in FIG. 8B.

By adopting the complex semiconductor device 400 including the separate pin diode 402 in this way, it is possible to eliminate constraints on the design of the pin diode 402 compared with the built-in diodes 5 and 4a of the super junction MOSFET 50. Because of this, as the pin diode 402 can easily be made higher in switching speed and lower in on resistance than the built-in diodes 5 and 4a, it is possible to obtain the previously described kind of complex semiconductor device 400 of the invention having high speed switching and low reverse recovery loss.

FIG. 4 is a diagram showing reverse recovery waveforms of the complex semiconductor device (FIG. 8A) of the embodiment and the super junction MOSFET (FIG. 5A) of the heretofore known structure, and shows results from simulating reverse recovery operation current waveforms with a supply voltage of 400V, a forward current of 20 A, and a temporal change in reverse current of 100 A/μs. The lifetime killer of the complex semiconductor device of FIG. 8A is set using He to be of a concentration profile with a depth of 8 μm from the source side surface of the parallel pn layer as a peak. Also, the area of the active region of the pin diode 402 of FIG. 8A is made the same as the area of the active region of the super junction MOSFET 50.

In the heretofore known structure, as both the reverse recovery current Irp and reverse recovery time trr are large, and the waveform rises steeply, the waveform oscillates greatly. Meanwhile, in the embodiment, it can be seen that the reverse recovery current Irp and reverse recovery time trr are kept small compared with in the heretofore known structure, and that reverse recovery loss is also reduced. Also, as the waveform rises gently, no ringing occurs after the rise.

In this way, it is possible to obtain a complex semiconductor device with which are realized an increase in reverse recovery operation speed, a reduction in loss, and a soft recovery.

Figure 9:
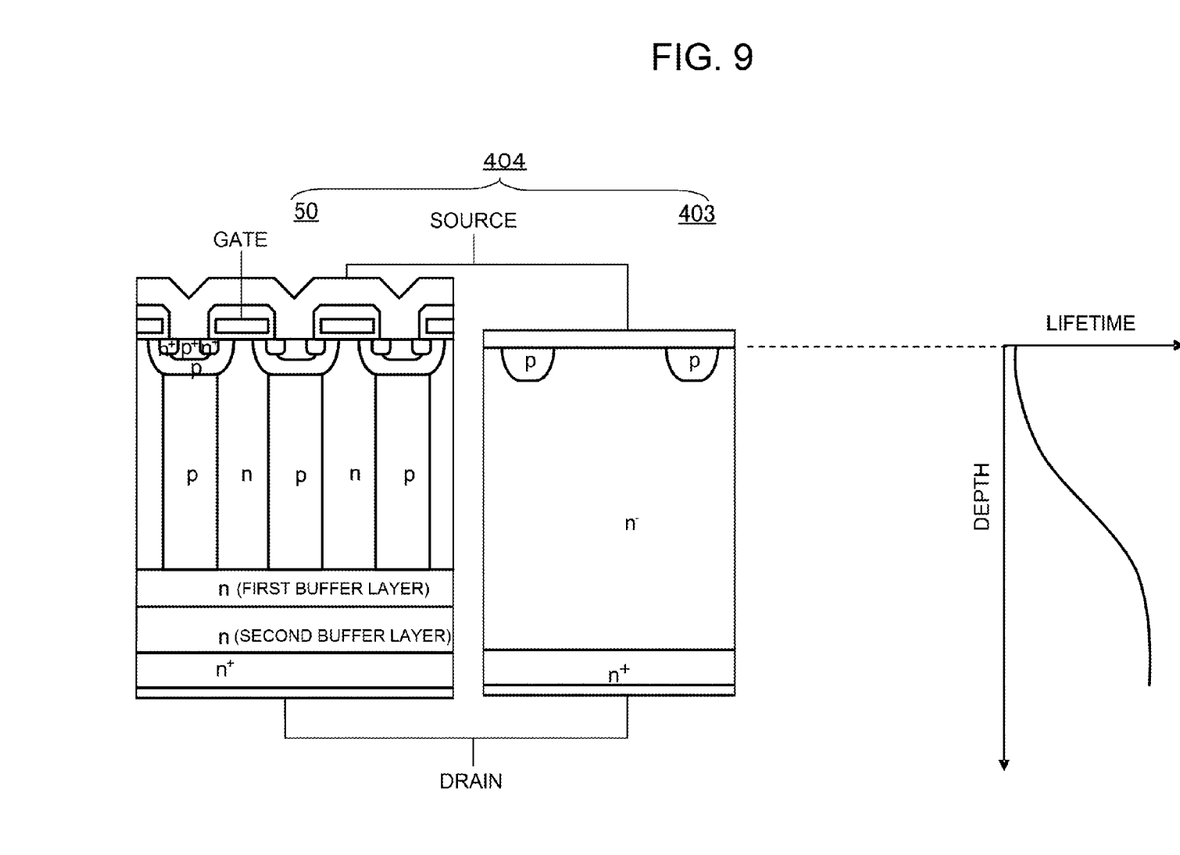
FIG. 9 shows a main portion sectional view of the super junction MOSFET according to the invention to which a schottky barrier diode is connected in parallel, and a carrier lifetime distribution chart in the substrate of the schottky barrier diode.

Furthermore, by adopting a complex semiconductor device wherein a kind of schottky barrier diode shown in FIG. 9, in place of the previously described pin diode, is joined in parallel to the super junction MOSFET, it is also possible to relax the hard recovery waveform when in reverse recovery operation, thus reducing the reverse recovery current Irp and reverse recovery time trr, and thus to obtain high speed switching and low reverse recovery loss, as previously described.

What is claimed is:

1. A super junction MOSFET comprising: a plurality of mutually parallel pn junctions extending in a vertical direction on a first principal surface of a first conductivity type drain layer; a parallel pn layer in which first conductivity type drift regions and second conductivity type partition regions, each sandwiched between adjacent pn junctions, are disposed alternately in contact with each other; and an MOS gate structure on the first principal surface side of the parallel pn layer; wherein a first conductivity type first buffer layer and a second buffer layer are provided, in that order from a second principal surface side of the parallel pn layer, between the second principal surface of the parallel pn layer and the drain layer; wherein the impurity concentration of the first buffer layer is a low concentration that is equal to or less than the same level as that of the impurity concentration of the drift region; wherein the impurity concentration of the second buffer layer is higher than that of the drift region; and wherein the parallel pn layer is shorter in carrier lifetime than the second buffer layer.

2. The super junction MOSFET according to claim 1, wherein the first buffer layer is shorter in carrier lifetime than the second buffer layer.

3. A method of manufacturing the super junction MOSFET according to claim 2, comprising:
making the carrier lifetimes of the parallel pn layer and first buffer layer shorter than that of the second buffer layer by adding a heavy metal or irradiating charged particles.

4. The super junction MOSFET according to claim 1, wherein the carrier lifetime of the second buffer layer is not adjusted.

5. A method of manufacturing the super junction MOSFET according to claim 1, comprising:
making the carrier lifetime of the parallel pn layer shorter than that of the second buffer layer by adding a heavy metal or irradiating charged particles.

6. A complex semiconductor device, wherein a pin diode that is higher in speed and smaller in on resistance than a pn diode built into the super junction MOSFET according to claim 1 is connected in reverse parallel to the super junction MOSFET.

7. A complex semiconductor device, wherein a schottky barrier diode that is higher in speed and smaller in on resistance than a pn diode built into the super junction MOSFET according to claim 1 is connected in reverse parallel to the super junction MOSFET.

* * * * *